(12) United States Patent
Strabel, III

(10) Patent No.: US 7,506,593 B2
(45) Date of Patent: Mar. 24, 2009

(54) MICROFABRICATION TOOL PEDESTAL AND METHOD OF USE

(75) Inventor: William D. Strabel, III, Mesa, AZ (US)

(73) Assignee: Kinetics Systems, Inc., Fremont, CA (US)

( * ) Notice: Subject to any disclaimer, the term of this patent is extended or adjusted under 35 U.S.C. 154(b) by 445 days.

(21) Appl. No.: 10/278,748

(22) Filed: Oct. 23, 2002

(65) Prior Publication Data

US 2004/0079855 A1    Apr. 29, 2004

(51) Int. Cl.
*A47B 3/06* (2006.01)

(52) U.S. Cl. ....................................... 108/156

(58) Field of Classification Search ................. 248/650, 248/670, 672, 673, 678, 677, 429, 440, 188.8, 248/188.91; 108/65, 69, 73, 28, 156, 161; 254/89 H, 89 R See application file for complete search history.

(56) References Cited

U.S. PATENT DOCUMENTS

| | | | |
|---|---|---|---|
| 4,597,553 A * | 7/1986 | Rorabaugh | 248/440 |
| 4,645,171 A | 2/1987 | Heide | |
| 4,934,423 A * | 6/1990 | Withrow | 144/286.1 |
| 4,976,415 A | 12/1990 | Murai et al. | |
| 4,989,826 A | 2/1991 | Johnston, Jr. | |
| 5,080,320 A * | 1/1992 | Chieng | 248/670 |
| 5,150,557 A * | 9/1992 | Gregory | 52/646 |
| 5,308,037 A * | 5/1994 | Gonzalez | 248/670 |
| 5,379,816 A * | 1/1995 | Charlton | 144/287 |
| 5,407,171 A * | 4/1995 | Gonzalez | 248/670 |
| 5,558,920 A | 9/1996 | Heide | |
| 5,820,092 A * | 10/1998 | Thaler | 248/237 |
| 5,947,430 A | 9/1999 | Ryan et al. | |
| 5,974,985 A * | 11/1999 | Flototto et al. | 108/157.18 |
| 6,443,429 B1 * | 9/2002 | Hawk et al. | 254/90 |
| 6,464,196 B1 * | 10/2002 | Crookham et al. | 248/519 |
| 6,556,741 B1 * | 4/2003 | Fan | 385/18 |

(Continued)

FOREIGN PATENT DOCUMENTS

DE    100 30 478 A    1/2002

(Continued)

OTHER PUBLICATIONS

J.B. Rodgers Mechanical Contractors, Inc./Kinetics entitled "Tool Pedestals" by Structural Steel Fabrication Facility, Phoenix, Arizona.

(Continued)

*Primary Examiner*—A. Joseph Wujciak, III
(74) *Attorney, Agent, or Firm*—Lowrie, Lando & Anastasi, LLP

(57) ABSTRACT

The present invention relates to equipment for supporting microfabrication tools, and in particular, to microfabrication tool pedestals including adjustable supports. According to one embodiment of the present invention, a pedestal for a microfabrication tool is provided. The pedestal includes a frame constructed and arranged to support the microfabrication tool and a plurality of supports movable along and connected to the frame. According to another embodiment of the present invention, a method of providing a supporting for a microfabrication tool is provided. The method includes providing a pedestal comprising a frame constructed and arranged to support the microfabrication tool and a plurality of supports connected to the frame, and laterally repositioning the supports relative to the frame.

29 Claims, 8 Drawing Sheets

U.S. PATENT DOCUMENTS

| | | | |
|---|---|---|---|
| 6,719,250 B2 * | 4/2004 | FitzSimons | 248/166 |
| 2002/0069610 A1 | 6/2002 | Schauer et al. | |
| 2002/0084402 A1 | 7/2002 | Schauer | |
| 2003/0071187 A1 * | 4/2003 | Herren et al. | 248/638 |

FOREIGN PATENT DOCUMENTS

| | | | | |
|---|---|---|---|---|
| JP | 200070046 A | * | 3/2000 | 19/8 |
| WO | WO 02/36301 A2 | | 5/2002 | |

OTHER PUBLICATIONS

Optical Tops: 780 Series CleanTop II Optical Tops, website: http://.www.techmfg.com/Products/OpticalTables/OpticalTops/7.htm, Jan. 30, 2003.

Semi E76-07299, Guide for 300 mm Process Equipment Points Connection to Facility Services, current edition approved by North American Regional Standards Committee on Aug. 15, 1998, pp. 1-12.

Semi E51-0200, Guide for Typical Facilities Services and Termination Matrix, current edition approved by North American Regional Standards Committee on Dec. 15, 1999, pp. 1-10.

International Search Report, PCT/US03/33364, dated Feb. 25, 2004.

* cited by examiner

MICROFABRICATION TOOL PEDESTAL AND METHOD OF USE

BACKGROUND OF INVENTION

1. Field of Invention

The present invention relates to equipment for supporting microfabrication tools, and, in particular, to microfabrication tool pedestals including adjustable supports.

2. Discussion of Related Art

Semiconductor manufacturing processes typically employ a series of relatively large tools. A typical tool may weigh approximately 7,500 pounds (3,400 kilograms) and may have approximately 3,500 pounds (1600 kilograms) of support equipment associated with it.

Semiconductor manufacturing facilities are traditionally designed to control air flow through the facility to reduce the risk of contamination of sensitive tools. In some facilities, air within the facility flows downward and through a sub floor before being purified and recirculated. Semiconductor manufacturing facilities are also traditionally designed to facilitate supply of chemicals and other tool inputs from an area beneath the tools.

Control of gas flow in a facility and easy supply of inputs to tools may both be facilitated by a sub floor having openings therein. Accordingly, sub floors having significant open area, such as poured concrete waffle sub floors, are common in semiconductor manufacturing facilities. Waffle floors conventionally include a grid with 18 inch (0.46 meter) openings therein.

The open nature of many semiconductor manufacturing facility sub floors means that placement of tools and other equipment must be planned so that portions of the tool or equipment requiring support are supported on the solid areas of the sub floor. However, the position of tools is often dictated by concerns other than the layout of the sub floor. Furthermore, a raised metal floor grid is traditionally installed above the sub floor. This raised floor is typically capable of supporting approximately 500 pounds per square foot (0.25 kilograms per square centimeter) of pressure, which is adequate for people and light equipment, but not for most semiconductor tools. Accordingly, a structure to support each tool on the sub floor and to raise it to the level of the raised floor is typically employed. This structure is commonly referred to as a pedestal.

Pedestals for tools are typically constructed of a metal frame resting on, and affixed to, the sub floor. Because tools vary in shape and size, the tops of pedestals also vary in shape and size and are conventionally custom made to fit the tool. Similarly, because the position of a tool is independent of the supporting portion of the sub floor, during installation of the tool, the legs of a pedestal may require removal and re-attachment to align with the supporting portions of the sub floor. In many cases, the legs are custom positioned by an engineer and a team of welders to support the pedestal and tool on the sub floor.

Semiconductor Equipment and Materials International (SEMI) has published guidelines for pedestals, including SEMI E76-0299 and Related Information 1, which are hereby incorporated by reference herein in their entirety. Standards regarding safety have also been promulgated by SEMI. For example, safety standards, such as the Uniform Building Code, state that semiconductor tools are not to be supported by gravity frictional connections, meaning that pedestals are typically constructed by welding.

SUMMARY OF INVENTION

According to one embodiment of the present invention, a pedestal for a microfabrication tool is provided. The pedestal includes a frame constructed and arranged to support the microfabrication tool and a plurality of supports movable along and connected to the frame.

According to another embodiment of the present invention, a pedestal for a microfabrication tool is provided. The pedestal includes a frame constructed and arranged to support the microfabrication tool, a plurality of supports arranged to support the frame, and means for adjusting the lateral position of the supports relative to the frame.

According to another embodiment of the present invention, a method of providing a supporting for a microfabrication tool is provided. The method includes providing a pedestal comprising a frame constructed and arranged to support the microfabrication tool and a plurality of supports connected to the frame, and laterally repositioning the supports relative to the frame.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
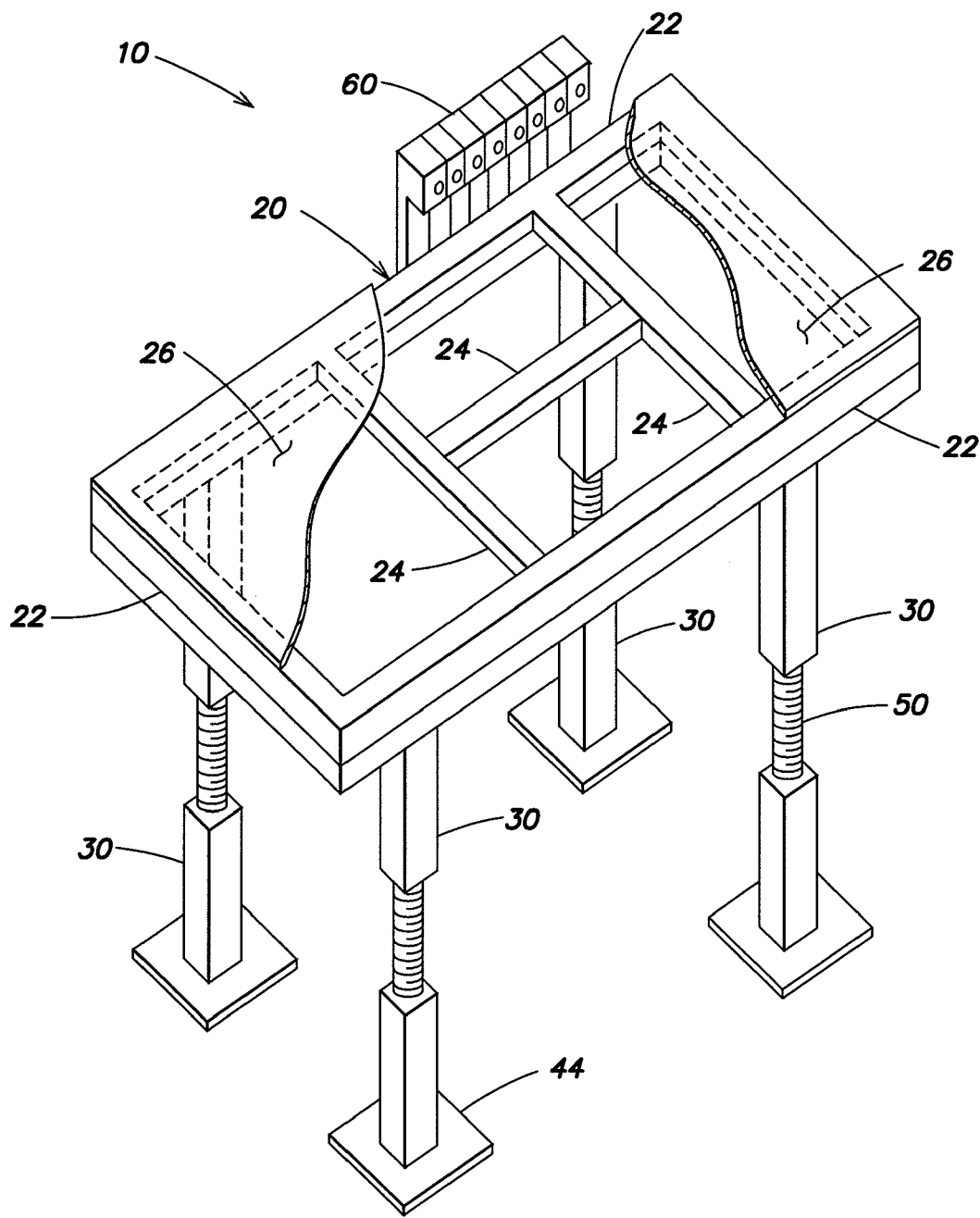
FIG. 1 is a perspective, plan view of a pedestal according to one embodiment of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

Conventional pedestals, such as the semiconductor process tool pedestals described in the Background, must be custom built for each type of tool and modified such that the legs or other supports contact appropriate locations on a sub floor. If a support on one of these pedestals aligns with a hole in the sub floor, the support must be cut off and moved. Customization not only takes time and delays completion of a manufacturing facility, but also risks contamination of sensitive processes due to the creation of particles during cutting and reattachment. As will be appreciated from the following description, embodiments of the present invention may be mass-produced because they are flexible enough to use with multiple tools and in various facilities. For example, the pedestals of the present invention are not required to match the outline of the tool. Furthermore, embodiments of the pedestal of the present invention are sufficiently adjustable to be re-useable in other factory locations and tools. Accordingly, embodiments of the present invention improve the flexibility and longevity of pedestals as well as the speed to market with manufacturing facilities.

The present invention relates to equipment for supporting microfabrication tools, and in particular, to microfabrication tool pedestals including adjustable supports and to a method of providing support for a microfabrication tool. In one embodiment, a pedestal for a microfabrication tool according to the present invention includes a frame constructed and arranged to support a microfabrication tool and a plurality of supports movable along and connected to the frame. In another embodiment, a method of providing a supporting for a microfabrication tool according to the present invention includes providing a pedestal comprising a frame and a plurality of supports connected to the frame, and laterally repositioning the supports relative to the frame.

As used herein, the term "microfabrication tool" refers to any piece of machinery, equipment, or the like, for which support by a pedestal may be desired and that is used in the processing of small geometry products. By way of example, product geometries in small geometry products are generally less than about 500 nanometers and greater than about 25 nanometers. Typical microfabrication tools are used in a clean room environment to process submicron devices. For example, microfabrication tools include conventional semiconductor process tools and tools for production of microelectrical machines (MEMS). As used herein, the term "pedestal" refers to any structure intended to support a tool. As used herein, the term "frame" refers to any structure generally sized and shaped to support a tool. As used herein, the term "support" refers to a structure connected to a pedestal frame that supports the pedestal on another structure, such as a sub floor. As will be described in greater detail below, supports may include legs and other similar structures.

As used herein, the term "movable along" means able to be repositioned at a plurality of points along a point of reference, such as a frame. For example, in one embodiment the flame lies substantially in a plane defined by orthogonal axes, and the supports are arranged substantially perpendicular to the plane and are movable along the frame along at least one of the orthogonal axes.

Figure 2:
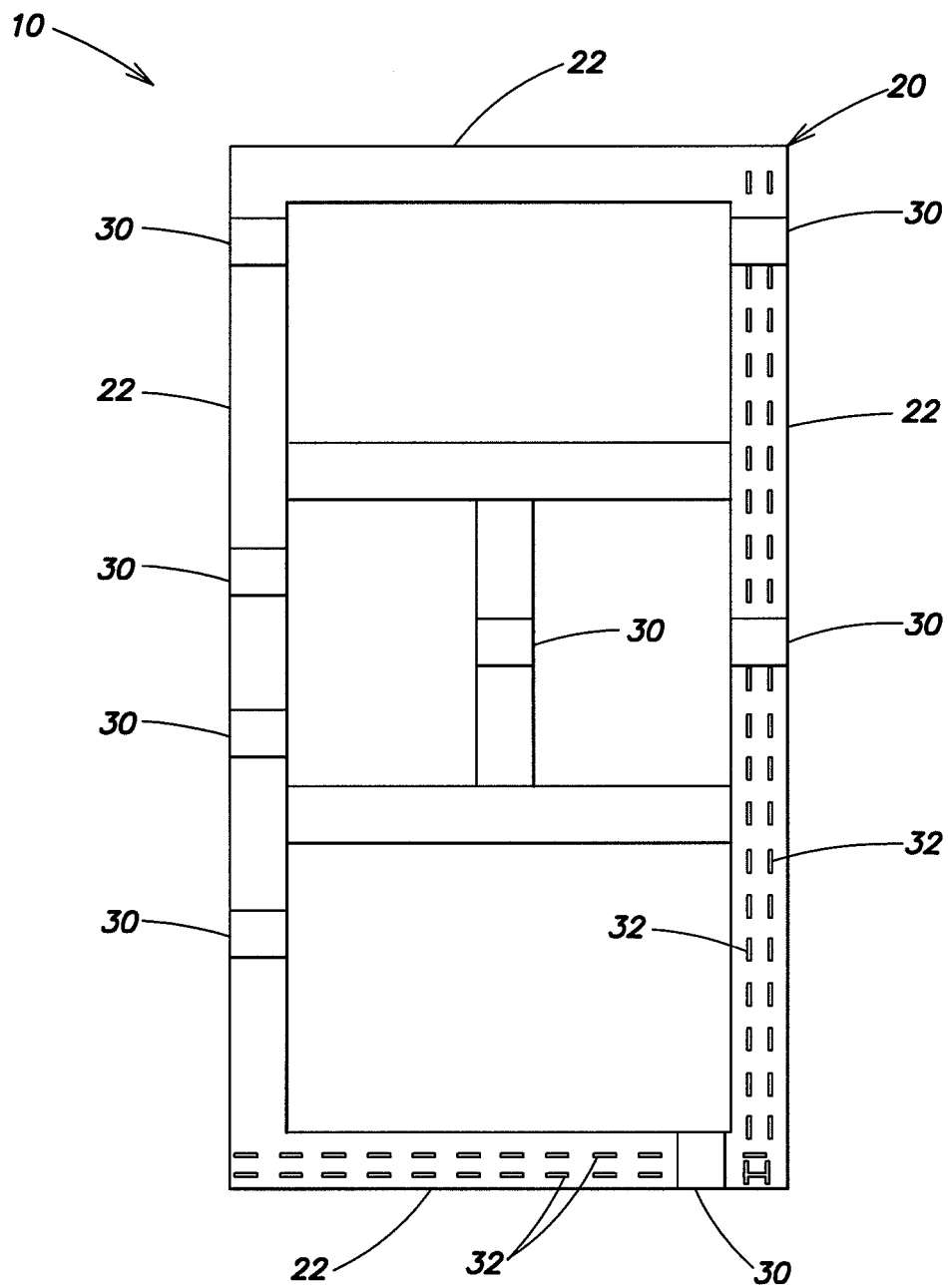
FIG. 2 is a top, plan view of a pedestal according to another embodiment of the present invention.
Figure 3:
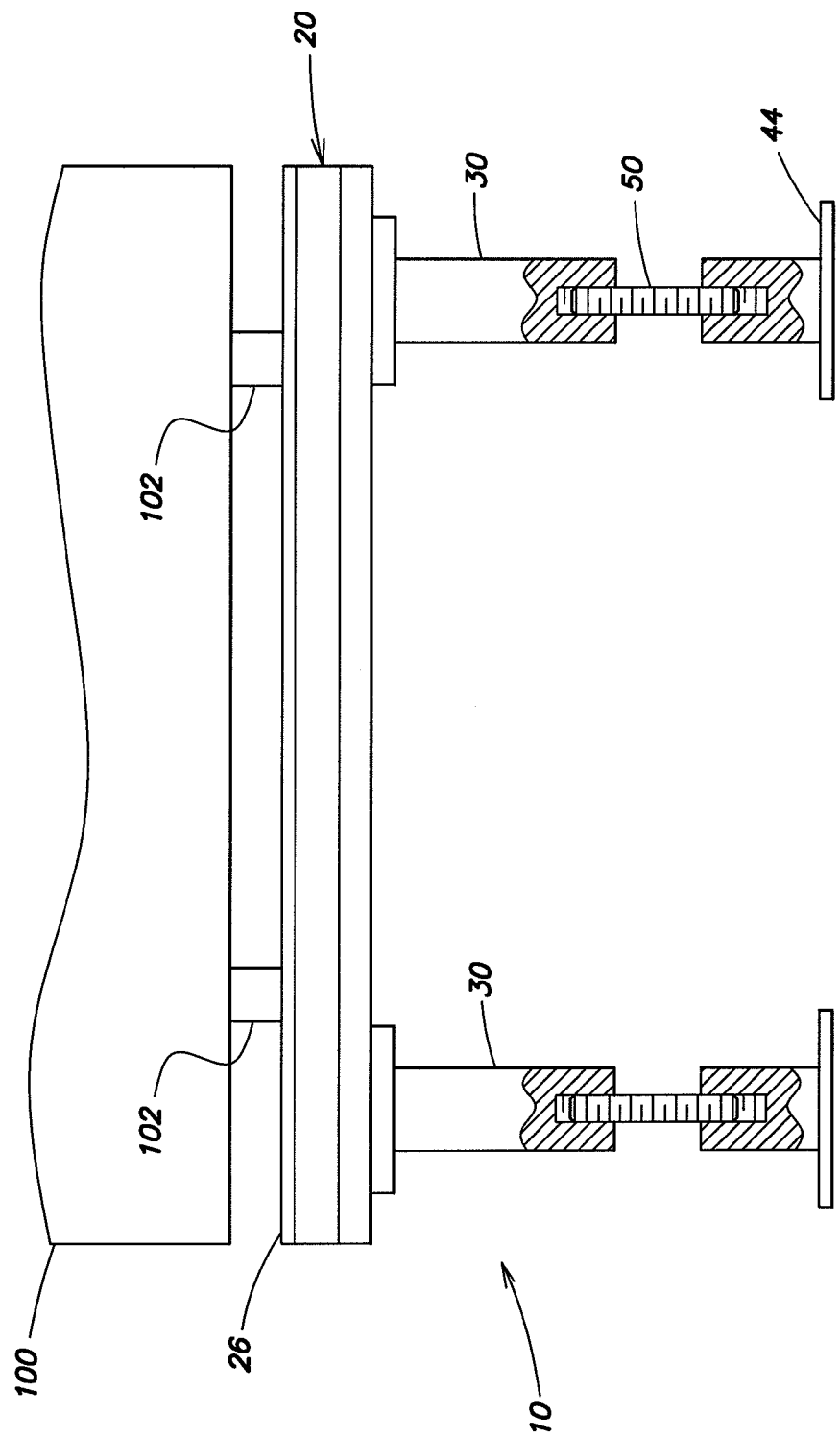
FIG. 3 is a lateral, plan view of a pedestal according to another embodiment of the present invention.

Referring now to the figures, and, in particular, FIGS. 1-3, specific embodiments of the present invention will be described by way of example. In one embodiment, a pedestal 10 for a microfabrication tool according to the present invention includes a frame 20 constructed and arranged to support a microfabrication tool 100 and a plurality of supports 30 movable along and connected to frame 20.

Frame 20 may be constructed in any manner and using any material or materials that allow it to support a desired microfabrication tool 100. For example, frame 20 may be sufficiently large to provide support to all relevant portions of tool 100, such as at one or more feet 102. In certain embodiments, the tool may be larger or smaller than the frame and may have a different overall shape, so long as all relevant portions of the tools are supported. As an example, in the semiconductor industry, certain tools may be approximately 11 feet by 6 feet (3.4 meters by 1.6 meters) and the frame may be of similar dimensions. Frame 20 need not be rectangular and, in certain embodiments, may be square, round, oval, L-shaped, irregularly shaped, or the like. Frame 20 may be sufficiently strong to support the weight of the tool. For example, frame 20 may be constructed of a material or materials strong and thick enough to support the weight of the tool.

As illustrated, frame 20 may be constructed of various connected elements 22, 24, such as pipes, tubes, or girders. Preferably, the elements are selected to be both strong and lightweight. To reduce weight and save material, the elements may be hollow, such as the square cross-section elements illustrated in the figures. The elements, whether hollow or solid, may have any cross-sectional shape that provides sufficient strength to the frame. For example, in addition to square cross-sections, rectangular, round, and oblong cross-sections are possible, In certain embodiments, frame 20 may include outer elements 22 and inner elements 24 to provide additional strength to the frame. Where a frame is assembled of elements, they may be connected to one another in any manner that provides sufficient strength and is suitable for the materials involved. For example, elements may be welded together, bolted together, or the like.

Figure 8:
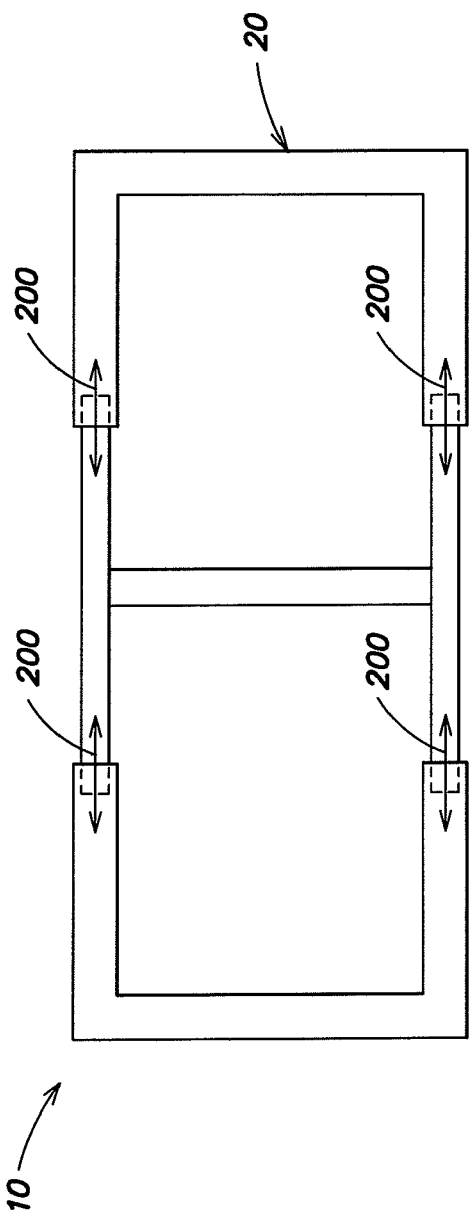
FIG. 8 is a top, plan view of a pedestal according to another embodiment of the present invention.

Frame 20 may have structure allowing it to adapt to use with additional tools and facilities. For example, frame 20 may be expandable. In one such embodiment, frame 20 may be constructed to allow additional frame sections to be attached thereto. For example, another section could be added to the frame by bolting, welding, and the like. In another embodiment, parts of the frame may be expandable, such that the existing frame can be varied in size and/or shape. For example, as illustrated in FIG. 8, elements of frame 20 may telescope as indicated by arrows 200, allowing the frame to be lengthened or shortened where desired. As another example, frame 20 may include threaded members between frame elements as described below for use in supports 30, allowing the frame to be expanded by turning the threaded members. Threaded members may also be positioned on the outer edge of the frame, for example at the corners, allowing the threaded members to mate with additional frame elements as described above.

Frame 20 may be constructed of any material or materials that are sufficiently strong to support a desired tool. The frame may also be constructed of materials that are unlikely to contaminate sensitive equipment, for example due to particle shedding, and that are relatively inexpensive and lightweight. Examples of materials that may be suitable for use in frame 20 include metals, metal alloys, and certain polymeric materials. For example, various steels, and, in particular, steels in accordance with ASTM A992, which is herby incorporated herein be reference in its entirety, may be suitable for producing frames according to the present invention. To summarize, ASTM A992 has the following chemical requirements in weight percent (heat analysis): carbon, maximum (max) 0.23; manganese, 0.50-1.50; silicon, max 0.40; vanadium, max 0.11; columbium, max 0.05; phosphorus, max 0.055; sulfur, max 0.045; copper, max 0.60; nickel, max 0.48; chromium, max 0.35; molybdenum, max 0.15, and the following tensile requirements: tensile strength, min kal (MPa), 65; yield point, ksi (Mpa), 50-65; yield to tensile ratio, max 0.85; elongation in 8 in. (200 mm) min %, 18; elongation in 2 in. (50 mm) min %, 21. As another example, the polymer polyetheretherketone may be sufficiently strong and durable to serve as a material for use on frame 20. In some embodiments, particular ceramic materials may also be useable for some of all for frame 20.

If a material that may shed particles is used in the frame or elsewhere in pedestal 10, it may be desired to coat the frame with another material that is less likely to shed particles. For example, a steel frame may be powder coated, or the like.

Pedestal 10 may include structure to provide additional area to the frame, allowing additional types of tools requiring support in different locations to be supported on the same pedestal. For example, a sheet or sheets of material, such as upper surface 26, may be included on frame 20. Upper surface 26 may include a piece of material configured to generally match the shape of the frame and the tool and may be connected to the rest of frame. In most embodiments, upper surface 26 will be a generally planar structure. For example, a sheet of material such as a metal, like steel, or any other material capable of supporting tool 100, may be connected to frame 20 by bolting, welding, or the like. Upper surface 26 may generally match the shape of underlying frame 20, but need not necessarily be the same size and shape as frame 20, so long as the overall structure is able to provide the desired support of relevant portions of microfabrication tool 100.

Supports 30 may be constructed in any manner and using any material or materials that provide adequate support for a given tool and application while also allowing the supports to be movable along the frame. For example, supports 30 may have any shape or configuration that is adequately strong to provide the desired support and is capable of being reconfigured to align with a sub floor as needed. Accordingly, supports 30 may comprise discrete leg-like elements, or may be larger and cover more area, such as a skirt, or the like. As it is typically desirable to block as little, if any, of openings in a sub floor as possible, smaller, discrete supports may be preferred.

Supports 30 may be connected to frame 20 in any manner that allows them to move along frame 20 and provide adequate support to frame 20. For example, supports 30 may be constructed such that they include structure that allows them to slide with respect to frame 20 and also to be firmly connected to frame 20 when in a desired location along frame 20. This slidable connection may be provided by a mating structure. For example, a mating railing or other structure may provide the slidable connection. It should be appreciated that not all of the supports on a pedestal need be adjustable to be within the scope of the present invention; it is enough that one of them is.

Figure 4:
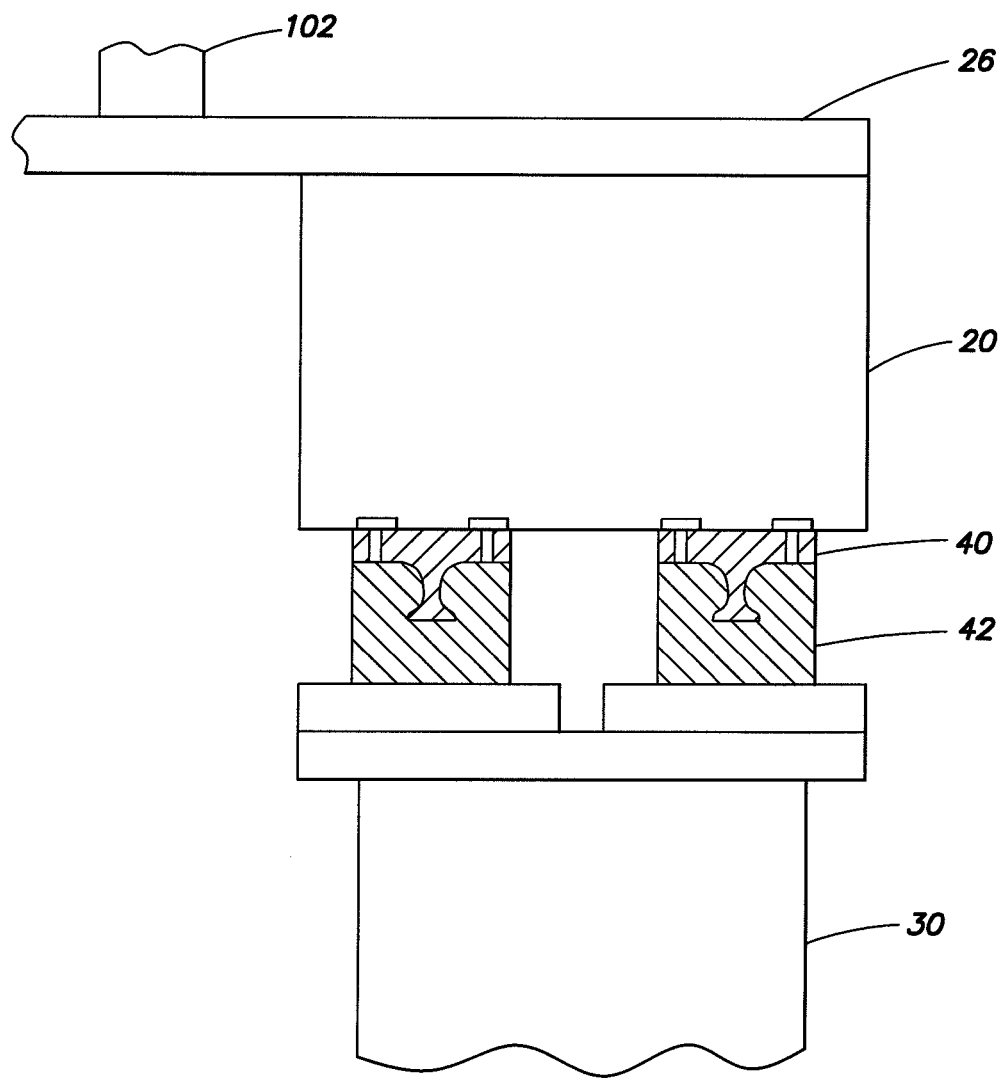
FIG. 4 is a cross-sectional view of one aspect of an embodiment of a pedestal according to the present invention.
Figure 5:
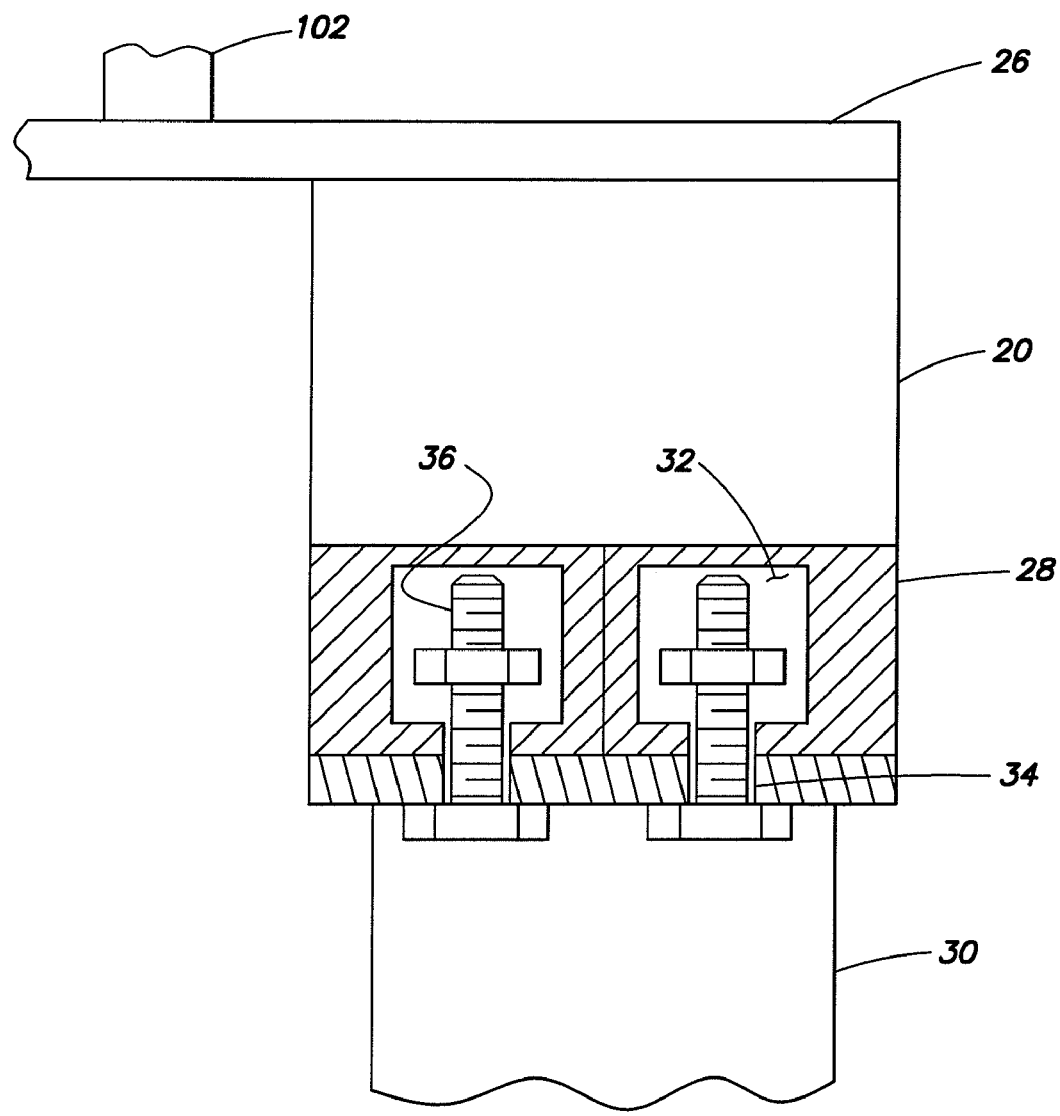
FIG. 5 is a cross-sectional view of another aspect of an embodiment of a pedestal according to the present invention.

Two examples of movable connections between frame 20 and supports 30 are illustrated in FIGS. 4-5. In the example illustrated in FIG. 5, a frame 30 includes an element 28, which need not be a separate element, having one or more channels 32 therein (see also FIG. 2). The top portion of support 30 has one more corresponding holes 34 therein. One more connectors 36 may mate with channels 32 and holes 34, connecting them. The connectors may be constructed so as to apply adjustable pressure to the connection between the support and the frame, allowing the connection to be loosened so that the support may be moved along the frame, and tightened when is a desired location. Connectors 36 may be any type of device able to mate with hole 34 and groove 32 and to apply adjustable pressure between them. In the illustrated embodiment, two connectors are associated with each support for added stability and the connectors are conventional bolts. Where connectors 36 are bolts, one end of the connector (e.g., either the bolt head or the nut) may be fixed within either the support or the channel, meaning that only the other end need be turned to loosen or tighten the connection.

A second example embodiment of a slidable connection is illustrated in FIG. 4. In this embodiment, one or more rails 40 mate with one or more tracks 42. The rail and track may be constructed such that the support fits relatively snugly with the frame, but is still slidable on the track. If desired, a locking mechanism may also be employed to fix the support relative to the frame once it is in a desire location. The railing may be mounted on either frame or the support, with the track being mounted on the other piece. The rail and track may be connected to the frame and support in any convenient, sufficiently sturdy manner. For example, the rail and/or track may be bolted or welded onto the frame or support. In the illustrated embodiment, two railings and tracks are used for improved stability.

Where there are parts that slide against one another in an embodiment of a pedestal of the present invention, the parts that contact one another may be constructed such that they minimize the risk of particle shedding. For example, they may be constructed from, or coated with, a material that resists shedding. In one example embodiment, a fluoropolymer coating may be used to reduce friction and inhibit shedding. Anti-shedding arrangements may be particularly desirable with the support members of the invention that are moveable along the frame. For example, in embodiments using a rail and track arrangement, an anti-shedding substance may be applied to one or both of the rail and the track.

Pedestal 10 may be designed such that, while supports 30 are adjustable, pedestal 10 will maintain acceptable load distribution for providing adequate support for a tool. For example, supports 30 movable on frame 20 may be moveable over a preselected distance, providing them with a fixed range of motion. The range of motion may be selected such that adequate support for the tool is provided anywhere along the range of motion. The range of motion may also be selected such that it is sufficient to allow a support to be moved to a desired location on a supporting surface. For example, where the pedestal is to rest on a sub floor having 18 inch (0.46 meter) gaps therein, the range of motion may be at least half as great as this distance, so that it will generally be possible to move a support to rest on the floor in one direction or the other. Some compromise between flexibility and structural support may be reached based upon a particular application. Examples of ranges of motion that may be suitable in particular applications include 6 inches (0.15 meters), 9 inches (0.23 meters), 12 inches (0.30 meters), and 18 inches (0.46 meters).

Supports 30 may include structure, such as alignment plates 44 to facilitate attachment of the supports to a sub floor 48 (see FIG. 6) or other surface. In some instances, the alignment plates my be contoured to match a surface. The alignment plates may include structure that facilitates their connection to the surface. For example, they may include holes though which a bolt or other connector may pass to secure them to a surface.

Because the desired height of a tool relative to a sub floor may vary based, for example, on the position of a raised floor, supports 30 may be constructed and arranged to be adjustable in length. The length of supports 30 may be adjustable in any manner that provides the desired degree of adjustment and is sufficiently stable to support tool 100. Because safety standards dictate that a tool should not be supported by gravity frictional connections, these types of connections may generally be avoided. However, it should be appreciated that frictional connections may be suitable for particular embodiments, and that the present invention in no way excludes such connections. As an example, a frictional connection may be used where a support has mating upper and lower portions and a hole in one portion and a slot in the other, The upper and lower portions may be telescoped to provide a pedestal at a desired height and a nut and bolt, or the like, used to fix them relative to one another. Even where a frictional connection is not preferred for a given application, this type of connection may be used and then the portions of the support may be fastened together by another method, such as welding. However, the irreversible nature of many of the suitable methods of fastening mean that this option is less desirable where the pedestal may be adjusted to reused.

Figure 6:
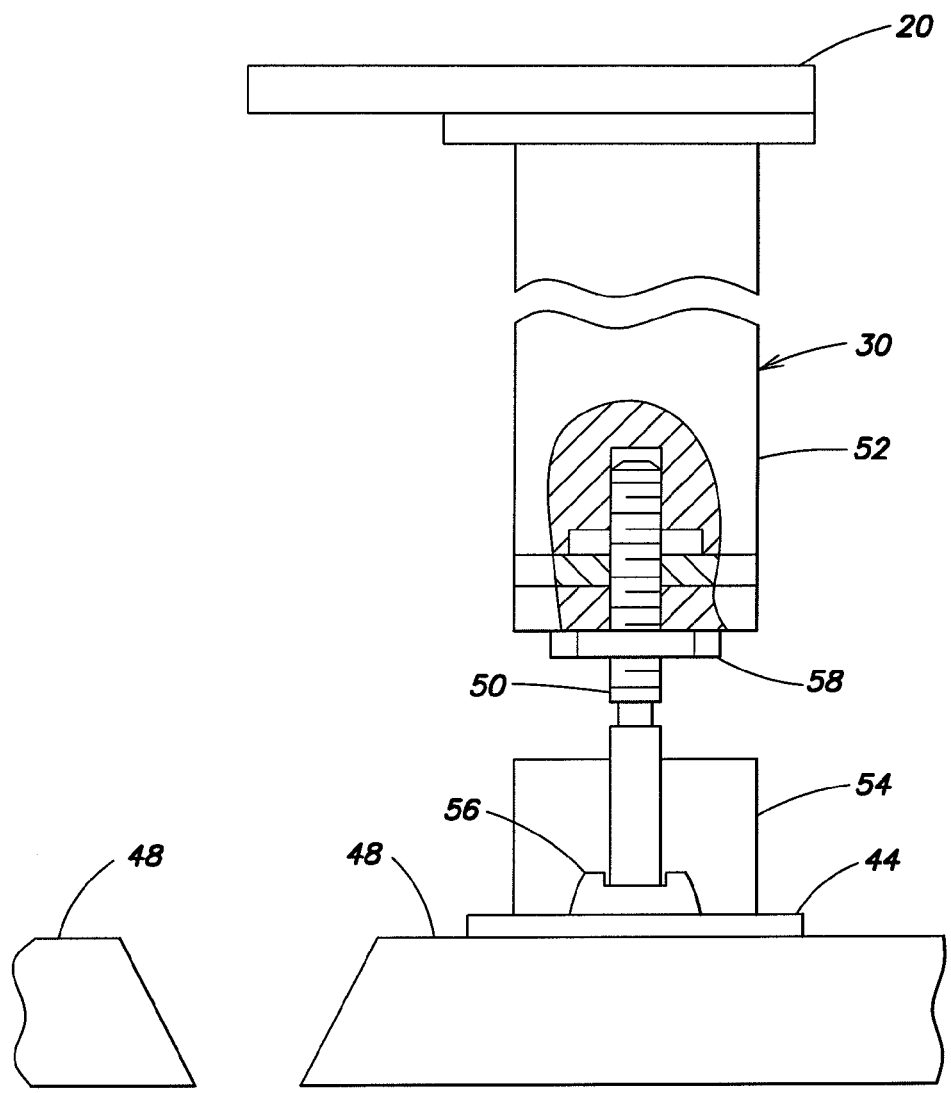
FIG. 6 is a cross-sectional view of another aspect of an embodiment of a pedestal according to the present invention.

To avoid the potential issues with frictional connections, a non-frictional adjustment mechanism may be used. A non-frictional adjustment mechanism may be constructed in any manner that is adequately sturdy for a particular application and provides a sufficient range of adjustment. An example of a non-frictional adjustment is illustrated in FIG. 6. In the example embodiment, a threaded member 50 connects an upper portion 52 and lower portion 54 of a support 30. The threaded member may be rotated to move the upper and lower portions of the support relative to the member, and, thus, one another. The threaded member is typically oriented in the axis of the support (generally vertically). The threaded member may be long enough to allow a desired degree of length adjustment and thick enough to provide sufficiently strong support.

Upper and lower portions 52, 54 may be constructed to receive threaded member 50 in any manner that allows for a sturdy connection. For example, where the upper and lower portions are solid, a threaded hole therein may allow them to receive the threaded member. Where the upper and lower portions are hollow, as illustrated, a nut or other similar structure including a suitably sized threaded opening may be installed within the upper and lower members. However upper and lower members 52, 54 are arranged to mate with the threaded member, they may be adapted to receive enough of the threaded member to provide a desired degree of adjustability. A lock nut 58 may be used to hold the threaded member in position when the desired height is achieved. In certain embodiments, such as that illustrated, the threaded member may only have a threaded connection to one of the upper and lower portions. The portion without the threaded connection may include structure, such as thrust bearing 56 allowing the threaded member to be turned while supporting a load.

Threaded member 50 may be constructed of any material able to hold threads therein and strong enough to provide desired support to the pedestal. Threaded member may also be constructed of a material that sheds little, or no, particles when the length of support 30 is adjusted. Any of the materials mentioned previously for use in constructing the frame may also be usable for this purpose.

Supports 30 may be constructed of any material or materials that allow them to provide a desired strength and stability to pedestal 10. Like the threaded member, the supports may be constructed of the same materials as frame 20. For example, supports 30 may be constructed of metals, metal alloys and polymeric materials.

In certain embodiments of the present invention, it may be desired for pedestal to dampen vibration. For example, a pedestal may be designed to isolate vibration generated in the tool supported thereon from other tools such as relatively sensitive tools, like photolithography equipment. The application may dictate the degree of vibration dampening desired. For example, for particular semiconductor facility applications, vibration is typically limited to less than 300 hertz, however, it should be appreciated that more or less sensitive facilities may dictate lower or higher vibration limits.

Where it is desired for the pedestal to dampen vibration, a vibration dampener may be used. As used herein, "vibration dampener" refers to a material or materials that is part of pedestal 10 and capable of absorbing vibrational energy. For example, the vibration dampener may comprise a resilient material able to absorb vibration. Any such material, such as rubber, foam, other resilient polymer, or the like, may be used. Materials specifically intended for use as vibration dampeners, such as Noise Killer vibration dampener, manufactured by Industrial Sound Dampening, Inc. of Tempe, Ariz., may also be used. Noise Killer vibration dampener is primarily latex with mica, talc and limestone fillers. Similar compositions manufactured by other sources may also be acceptable in particular embodiments. Noise Killer vibration dampener is reported to be capable of reducing vibration by as much as 50%.

Figure 9:
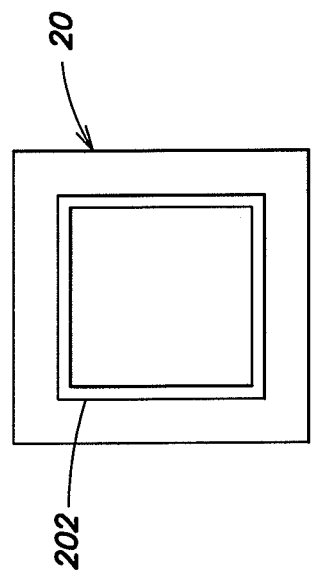
FIG. 9 is a cross-sectional view of another aspect of an embodiment of a pedestal according to the present invention.

Vibration dampener may be applied anywhere in pedestal 10 where it will dampen vibration and will not interfere with the support function of the pedestal. For example, as illustrated in FIG. 9, vibration dampener 202 may be applied inside of hollow elements of frame 20 or portions of supports 30.

Figure 7:
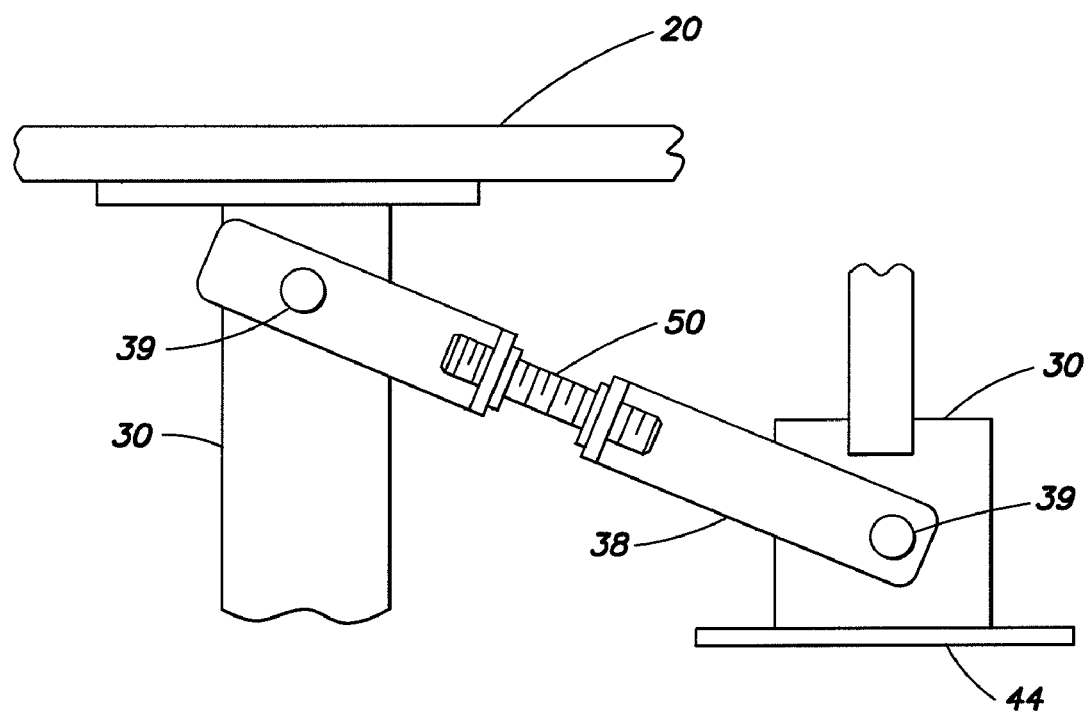
FIG. 7 is a cross-sectional view of another aspect of an embodiment of a pedestal according to the present invention.

To further aid in the reduction of vibration, and to improve resistance to damage from seismic activity, pedestals may include structure constructed and arranged to improve the stiffness of the pedestal. For example, crossbars, braces, or the like may connect supports 30 to one another. FIG. 7 illustrates an example embodiment having a brace 38. Brace 38 may be constructed in such a manner that it does not interfere with the adjustability of supports 30. For example, the length of brace 38 may be adjustable in a similar manner to the manner in which supports 30 may be adjustable. Brace 38 may also be connected to supports 30 using a movable joint 39, allowing the brace to move relative to the supports as they are adjusted.

Pedestal 10 according to the present invention may include structure to facilitate connection between the tool and any inputs thereto. For example, a connection facilitator 60 may be positioned on pedestal 10. Connection facilitator 60 may be constructed in any manner that provides a common location at which inlets to the tool can be connected to appropriate outlets outside the tool, and vice versa. Connection facilitator 60 may be constructed and arranged such that it improves the flexibility of the pedestal. For example, the connection facilitator may be moveable along pedestal 10, most typically along frame 20, to allow it to be used with different tools and manufacturing facilities. This movable connection may be constructed in a similar manner to that of the movable connection of supports 30 to frame 20. Connection facilitator 60 may include common connectors used with tools in a particular industry.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A pedestal for a microfabrication tool, comprising;
   a frame constructed and arranged to support at least a weight of the microfabrication tool; and
   at least three supports constructed and arranged to support the frame from below the frame, each support connected to the frame at a respective connection point, wherein at least two of the at least three supports are movable horizontally along the frame and relative to the frame within a perimeter defined by the frame independently of the respective connection point of each of the other supports of the at least three supports.

2. The pedestal of claim 1, wherein the frame lies substantially in a plane defined by orthogonal axes, wherein the at least three supports are arranged substantially perpendicular to the plane, and wherein at least one of the at least three supports is movable along the frame and relative to the frame along at least one of the orthogonal axes.

3. The pedestal of claim 1, wherein the at least two of the at least three supports are slidably connected to the frame.

4. The pedestal of claim 3, wherein the frame comprises a rail and wherein the at least two of the at least three supports are arranged to slidably connect with the rail.

5. The pedestal of claim 3, wherein the frame comprises a channel and wherein the at least two of the at least three supports are arranged to slidably connect with the channel.

6. The pedestal of claim 1, wherein at least one of at least three supports is adjustable in length.

7. The pedestal of claim 6, wherein the at least one of the at least three supports comprises a threaded member positioned substantially along a vertical axis of the at least one support that is constructed and arranged to allow adjustment of a length of the at least one of the at least three supports.

8. The pedestal of claim 1, wherein the pedestal comprises means for dampening vibration.

9. The pedestal of claim 1, wherein the pedestal comprises a vibration dampener.

10. The pedestal of claim 9, wherein the vibration dampener comprises a resilient polymeric material.

11. The pedestal of claim 9, wherein the vibration dampener is positioned on the inside of at least a portion of the pedestal.

12. The pedestal of claim 1, further comprising an adjustable length brace connected to a first and a second of the plurality of supports.

13. The pedestal of claim 1, further comprising a connection facilitator connected to the frame.

14. The pedestal of claim 1, further comprising an upper surface constructed and arranged to support the microfabrication tool and connected to the frame.

15. The pedestal of claim 1, wherein the microfabrication tool is a semiconductor process tool.

16. The pedestal of claim 1, wherein the microfabrication tool is a microelectrical machine process tool.

17. The pedestal of claim 1, wherein the frame is constructed and arranged to be expandable.

18. The pedestal of claim 17, wherein the frame comprises a telescoping element constructed and arranged to allow expansion of the frame.

19. The pedestal of claim 17, wherein the frame comprises a threaded element constructed and arranged to allow expansion of the frame.

20. The pedestal of claim 1, further comprising at least one additional support connected to the frame.

21. The pedestal of claim 1, wherein the weight of the microfabrication tool is about 7,000 pounds.

22. The pedestal of claim 1, wherein the frame is constructed and arranged to support at least a weight of the microfabrication tool on an upper surface of the frame.

23. A pedestal to support a microfabrication tool, the pedestal comprising:
   a frame constructed and arranged to support at least a weight of the microfabrication tool;
   at least three supports attached to the frame at a connection point below the frame; and
   means for laterally adjusting a position of at least two of the at least three supports horizontally along the frame and relative to the frame within a perimeter defined by the frame independently of the position of each of the other supports of at least three supports.

24. The pedestal of claim 23, wherein the frame is constructed and arranged to support at least a weight of the microfabrication tool on an upper surface of the frame.

25. A method of providing a support for a microfabrication tool, comprising:
   providing a pedestal comprising a frame constructed and arranged to support at least a weight of the microfabrication tool and at least three supports each connected to the frame at a respective position below the frame; and
   laterally repositioning at least one of the at least three supports horizontally along the frame and relative to the frame within a perimeter defined by the frame independently of the respective position of each of the other of the at least three supports.

26. The method of claim 25, further comprising adjusting the length of the supports to provide a desired height of the frame.

27. The method of claim 25, wherein laterally repositioning at least one of the at least three supports comprises repositioning the at least one of the at least three supports to align with a selected location on a mounting floor.

28. The method of claim 25, further comprising positioning a microfabrication tool on the pedestal.

29. The method of claim 25, wherein providing a pedestal comprises providing a pedestal comprising a frame constructed and arranged to support at least a weight of the microfabrication tool on an upper surface of the frame.

* * * * *